United States Patent [19]

Watanabe et al.

[11] Patent Number: 5,491,425
[45] Date of Patent: Feb. 13, 1996

[54] APPARATUS FOR EVALUATING CHARACTERISTICS OF SEMICONDUCTOR DEVICE AND METHOD OF EVALUATING CHARACTERISTICS OF SEMICONDUCTOR DEVICE USING THE SAME

[75] Inventors: Toru Watanabe, Hopewell Junction, N.Y.; Yuri Yonekura, Kawasaki, Japan; Katsuya Okumura, Poughkeepsie, N.Y.

[73] Assignee: Kabushiki Kaisha Toshiba, Kawasaki, Japan

[21] Appl. No.: 215,774

[22] Filed: Mar. 22, 1994

[30] Foreign Application Priority Data

Apr. 19, 1993 [JP] Japan .................................. 5-091270

[51] Int. Cl.⁶ .................................................. G01R 1/06
[52] U.S. Cl. .......................................... 324/754; 439/179
[58] Field of Search .................................. 439/179, 764, 439/178; 324/765, 754

[56] References Cited

U.S. PATENT DOCUMENTS

| | | | |
|---|---|---|---|
| 3,622,944 | 11/1971 | Tsuchiya | 439/179 |
| 4,289,369 | 9/1981 | Taketoshi | 439/179 |
| 4,409,546 | 10/1983 | Shulman . | |
| 4,587,484 | 5/1986 | Shulman | 439/179 |
| 5,325,052 | 6/1994 | Yamashita | 324/765 |

FOREIGN PATENT DOCUMENTS

0453147A1  10/1991  European Pat. Off. .

OTHER PUBLICATIONS

Koens, "Micromanipulator Liquid Contact Tester Probe," IBM Technical Disclosure Bulletin, vol. 15, No. 1, Jun. 1972.

Greene et al., "Electro-Machining of Test Probes," IBM Technical Disclosure Bulletin, vol. 21, No. 5, Oct. 1978.

*Primary Examiner*—Kenneth A. Wieder
*Assistant Examiner*—Mark Wardas
*Attorney, Agent, or Firm*—Finnegan, Henderson, Farabow, Garrett & Dunner

[57] ABSTRACT

A probe is attached to a support plate vertically to the surface of the support plate. A drop of a molten metal is formed at a tip portion of the probe. The support plate has a heater for setting the temperature of the probe and the drop of the molten metal at the tip portion of the probe. The probe is situated at a position corresponding to a position of an electrode of an LSI. The probe is connected to a measuring device for evaluating characteristics of the LSI by wiring. The drop of the molten metal connects the probe and the electrode of the LSI electrically.

17 Claims, 9 Drawing Sheets

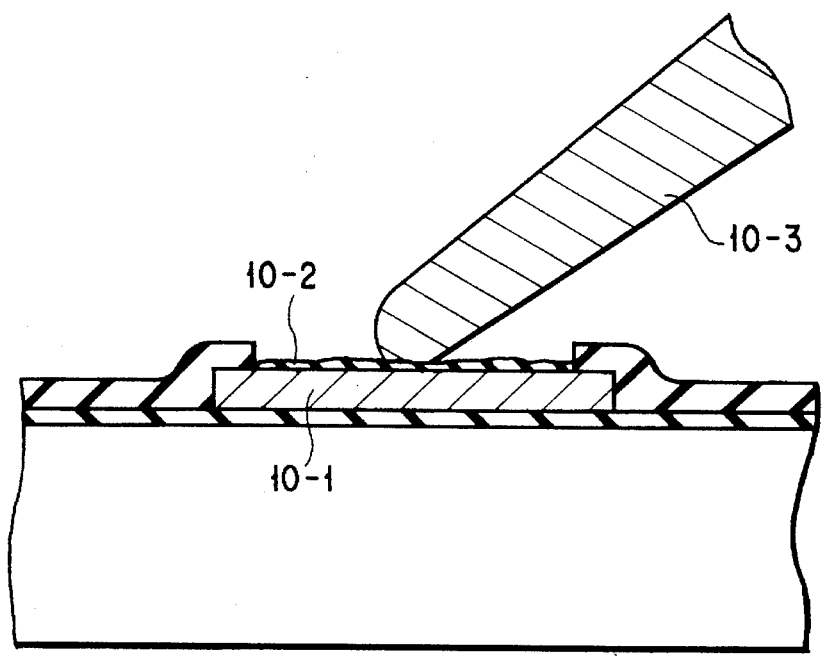
F I G. 1
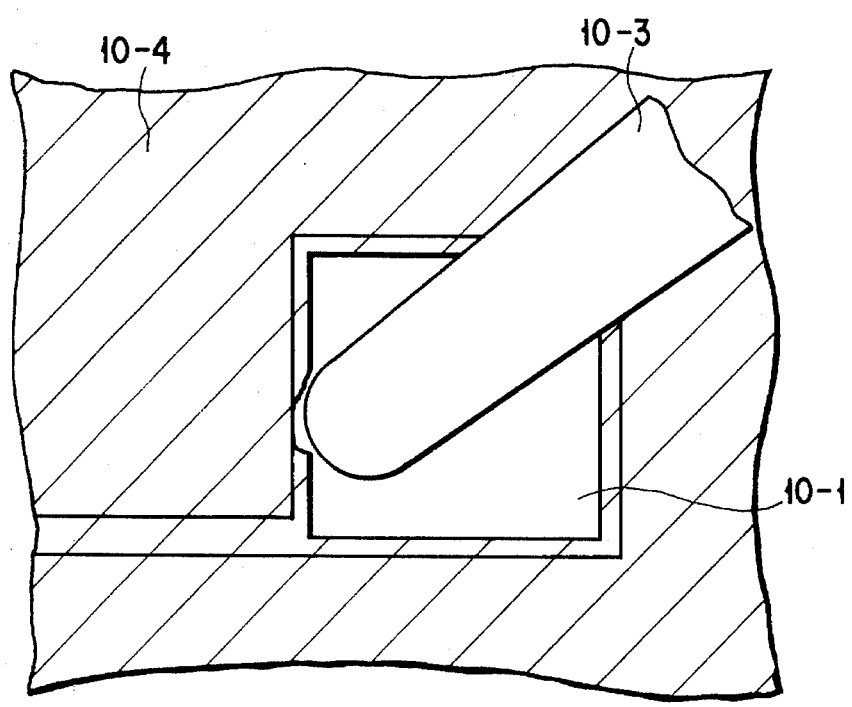
F I G. 2

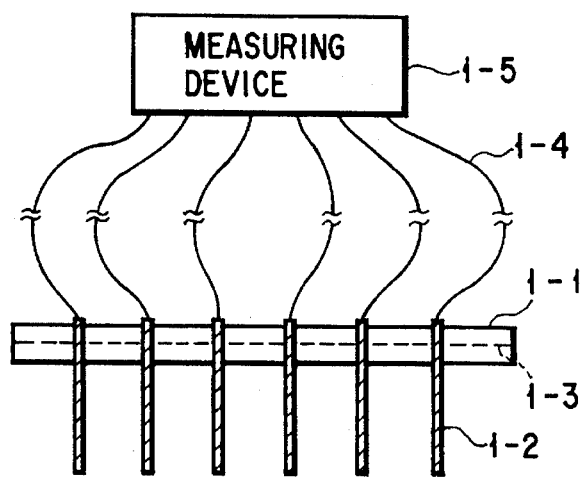
F I G. 3
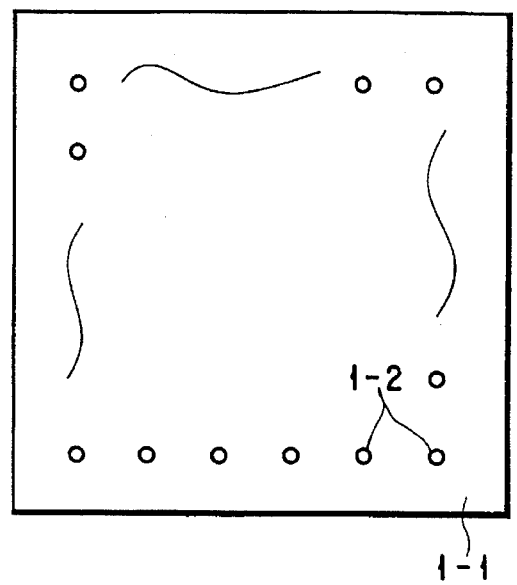
F I G. 4
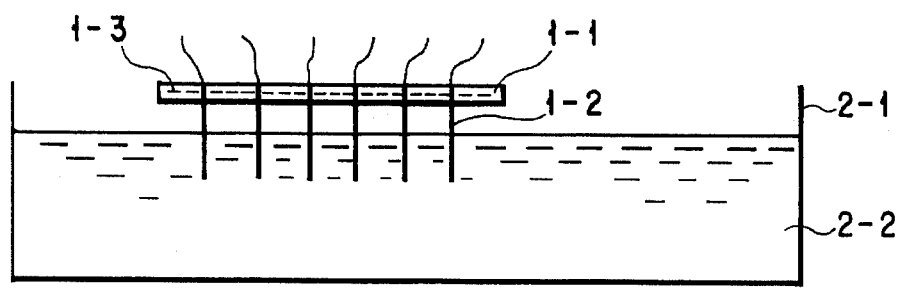
F I G. 5
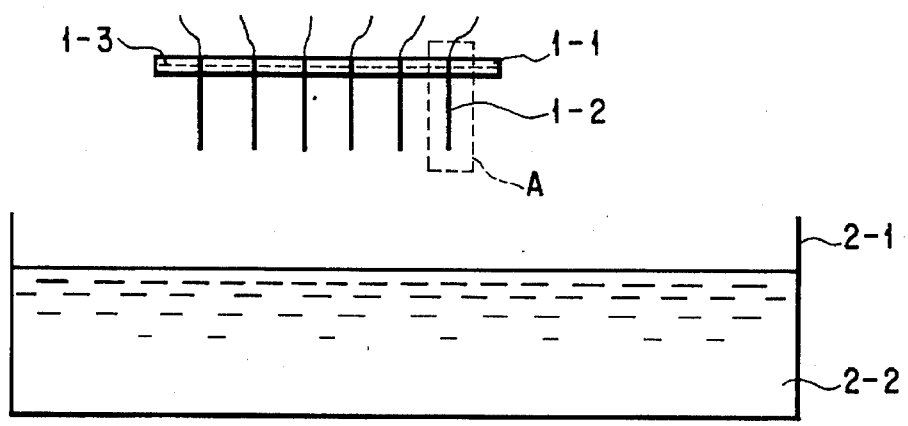
F I G. 6

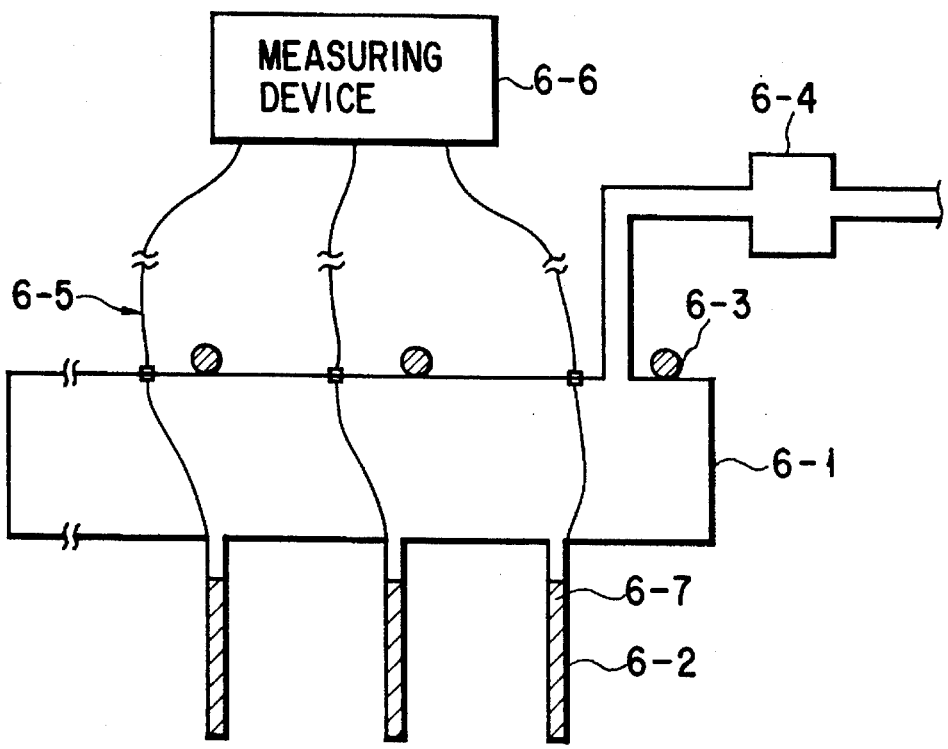
F I G. 13
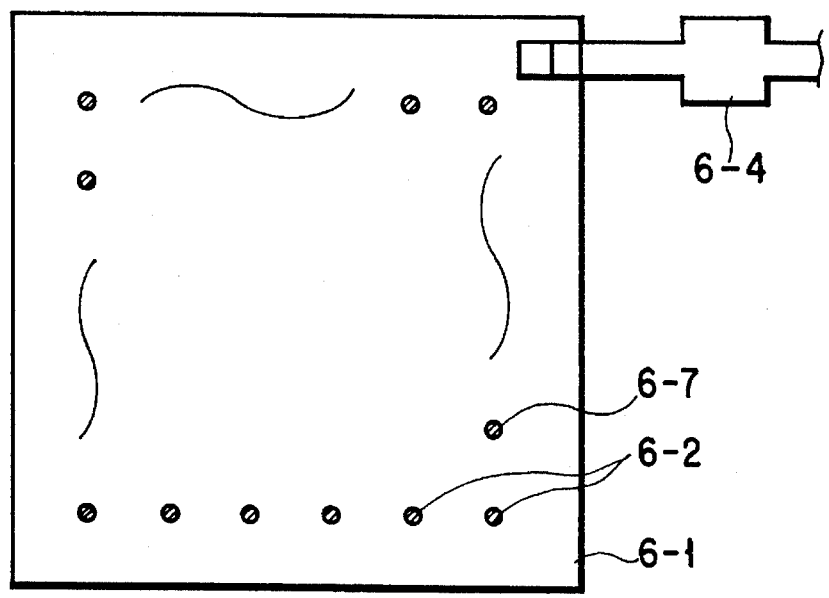
F I G. 14

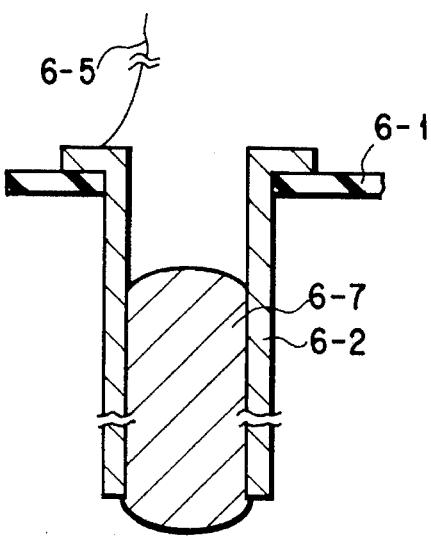
F I G. 15
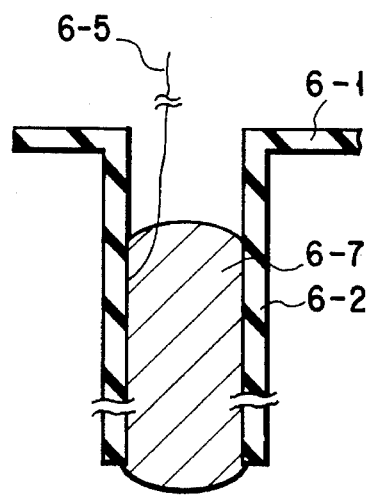
F I G. 16
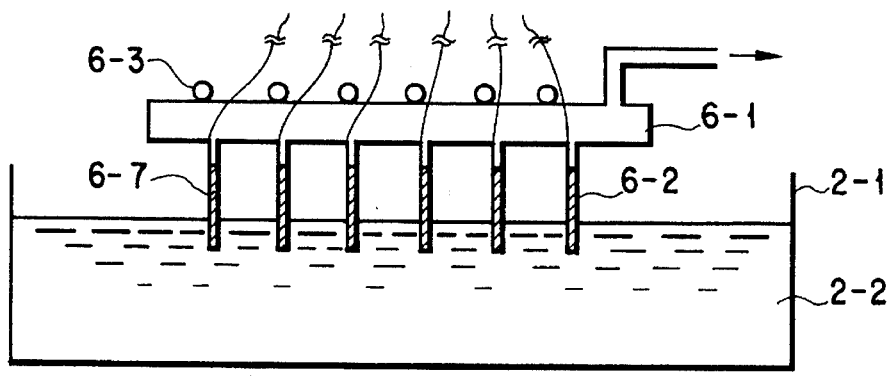
F I G. 17
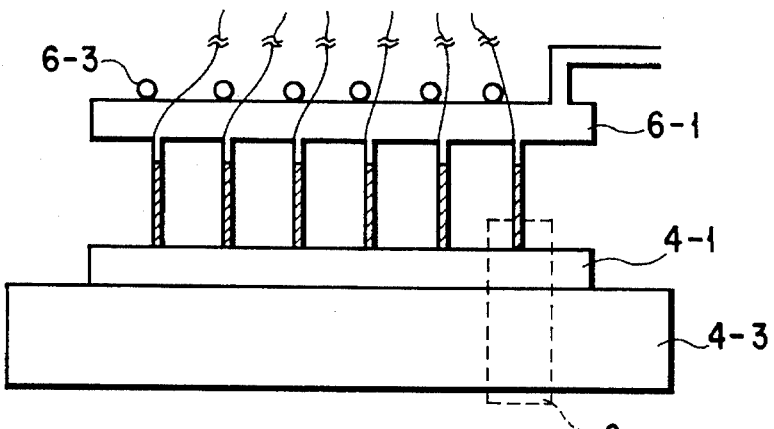
F I G. 18

APPARATUS FOR EVALUATING CHARACTERISTICS OF SEMICONDUCTOR DEVICE AND METHOD OF EVALUATING CHARACTERISTICS OF SEMICONDUCTOR DEVICE USING THE SAME

BACKGROUND OF THE INVENTION

1. Field of the Invention

The present invention relates generally to an apparatus for evaluating characteristics of an LSI and a method of evaluating characteristics of an LSI using the apparatus, and more particularly to an apparatus and a method for obtaining a contact between a probe and a signal take-out electrode of an LSI.

2. Description of the Related Art

In general, an LSI includes, as part of wiring, a pad (electrode) connected electrically to an external circuit, etc. The characteristics of the LSI can be evaluated by applying a signal to the LSI, with a probe made of tungsten, etc. put in contact with the pad of the LSI.

FIG. 1 shows the state in which the probe is put in pressure contact with the pad of the LSI.

A wiring material of the LSI is an alloy consisting mainly of aluminum. The surface of a pad 10-1 is covered with an aluminum oxide film 10-2. The oxide film 10-2 prevents electric conduction between the pad 10-1 and a probe 10-3. In order to evaluate the characteristics of the LSI exactly, the oxide film 10-2 must be removed.

There are two conventional methods (a) and (b) of removing the oxide film 10-2 and evaluating the characteristics of the LSI:

(a) A method of mechanically removing an oxide film on the surface of a pad.

As is shown in FIG. 2, a tip portion of the probe 10-3 is put in pressure contact with the surface of the pad 10-1 at an angle less than 90° C. In this case, the tip portion moves over the surface of the pad 10-1 under pressure produced by elasticity of the probe 10-3. As a result, the oxide film 10-2 adhered to the surface of the pad 10-1 is raked off by the moving probe 10-3.

The method (a) makes use of elasticity of the probe 10-3. Thus, if an excessive load is applied to the probe 10-3, the probe 10-3 slides and damages a protective insulating film 10-4 provided around the pad 10-1. In a worst case, the probe 10-3 destroys the pad 10-1 itself. Since the probe 10-3 is situated at an angle to the surface of the pad 10-1, it is not possible to arrange probes at high density. In the case of an LSI having a plurality of pads arranged at a narrow pitch, it is difficult to evaluate the characteristics of the LSI.

(b) A method of chemically attaining contact between a probe and a pad.

This method adopts a mercury contact system employed widely in relays, etc. The electric conduction between the probe and the pad is attained through molten mercury (Hg). According to the method (b), mercury constitutes an amalgam with material of the pad (metal) and accordingly an oxide film on the pad can be removed. In addition, abnormal discharge occurring when the probe comes out of contact with pad can be prevented, and electric contact between the probe and the pad can be stabilized.

Mercury, however, is harmful, as is well known. In addition, mercury has a high vapor pressure and tends to evaporate easily. Thus, if the method (b) is carried out, the characteristics of the LSI must be evaluated within a completely sealed space.

SUMMARY OF THE INVENTION

The present invention has been made to solve the above problems, and its object is to provide an apparatus and method for evaluating characteristics of a semiconductor device, wherein electric contact between a probe and a pad can be attained easily and stably.

In order to achieve the object, there is provided an apparatus for evaluating characteristics of a semiconductor device, the apparatus comprising: a support plate; and a probe supported by the support plate, situated at a position corresponding to a position of an electrode of the semiconductor device to be measured, provided with a tip portion for holding a molten metal, and connected to a measuring device for evaluating the characteristics of the semiconductor device.

The support plate is provided with a heater for setting the temperature of the probe and the molten metal held by the probe. The probe is attached to the support plate vertically to the surface of the support plate.

There is also provided an apparatus for evaluating characteristics of a semiconductor device, the apparatus comprising: a hollow container; a probe having a cylindrical structure, situated at a position corresponding to a position of an electrode of the semiconductor device to be measured, attached to the hollow container, and connected to a measuring device for evaluating the characteristics of the semiconductor device; and a pump, attached to the hollow container, for setting a pressure within the hollow container and holding a molten metal in the probe.

The hollow container is provided with a heater for setting the temperature of the probe and the molten metal held by the probe. The probe is attached to the hollow container vertically to the surface of the hollow container.

There is also provided a method of evaluating characteristics of a semiconductor device, comprising the steps of: forming a drop of a molten metal at a tip portion of a probe situated at a position corresponding to a position of an electrode of the semiconductor device to be measured; bringing the drop of the molten metal into contact with the electrode of the semiconductor device, and electrically connecting the semiconductor device and the probe; and applying an electric signal to the semiconductor device and evaluating the characteristics of the semiconductor device.

The drop of the molten metal is formed by immersing the tip portion of the probe in the molten metal and then pulling up the probe. The probe and the drop of the molten metal are kept at a temperature higher than a melting point of the molten metal. The semiconductor device is kept at a temperature higher than a melting point of the molten metal.

There is also provided a method of evaluating characteristics of a semiconductor device, comprising the steps of: making a molten metal sucked in a cylindrical probe situated at a position corresponding to a position of an electrode of the semiconductor device to be measured; moving a tip portion of the probe over the electrode of the semiconductor device; forming a drop of the molten metal at the tip portion of the probe; bringing the drop of the molten metal into contact with the electrode of the semiconductor device, and electrically connecting the semiconductor device and the probe; and applying an electric signal to the semiconductor device and evaluating the characteristics of the semiconductor device.

The molten metal is sucked in the probe by immersing the tip portion of the probe in the molten metal and then decreasing a pressure within the probe to a negative pressure level. The drop is formed by increasing a pressure within the probe. The probe and the molten metal in the probe are kept at a temperature higher than a melting point of the molten metal. The semiconductor device is kept at a temperature higher than a melting point of the molten metal.

According the apparatus for evaluating characteristics of semiconductor device having the above structure, the probe has a function of holding a molten metal and the probe and the pad of the LSI to be measured are electrically connected via the molten metal. Since the molten metal reacts chemically with the underlying pad to produce a molten alloy, the oxide film adhering on the electrode of the LSI can be removed.

Since there is no need to put the probe in direct contact with the electrode to mechanically remove the oxide film on the surface of the electrode, no damage is caused to the electrode or peripheral protective film. Furthermore, since there is no need to put the probe in direct contact with the electrode, it is not necessary to consider sliding or displacement of the probe in the horizontal direction. In other words, electric contact between the electrode and probe can be attained vertically to the surface of the electrode. Therefore, probes can be arranged at high density, contributing to characteristic evaluation of an LSI with pads of a narrow pitch and many pins.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows the state in which a conventional probe is put in contact with a pad;

FIG. 2 shows the state in which a conventional probe is put in contact with a pad;

FIG. 3 shows an apparatus for evaluating characteristics of a semiconductor device according to a first embodiment of the present invention;

FIG. 4 shows a support plate in the apparatus shown in FIG. 3;

FIG. 5 illustrates one step of a characteristic evaluation method using the apparatus shown in FIG. 3;

FIG. 6 illustrates another step of the characteristic evaluation method using the apparatus shown in FIG. 3;

FIG. 13 shows an apparatus for evaluating characteristics of a semiconductor device according to a second embodiment of the present invention;

FIG. 14 shows a hollow container of the apparatus shown in FIG. 13;

FIG. 15 shows a coupling portion between the hollow container of the apparatus shown in FIG. 13 and a probe;

FIG. 16 shows a coupling portion between the hollow container of the apparatus shown in FIG. 13 and a probe;

FIG. 17 illustrates one step of a characteristic evaluation method using the apparatus shown in FIG. 13;

FIG. 18 illustrates another step of the characteristic evaluation method using the apparatus shown in FIG. 13;

DETAILED DESCRIPTION OF THE PREFERRED EMBODIMENTS

Characteristic evaluation apparatus and methods for semiconductor devices according to the present invention will now be described with reference to the accompanying drawings.

FIGS. 3 and 4 show an apparatus for evaluating characteristics of a semiconductor device according to a first embodiment of the present invention.

A plurality of probes 1-2 are attached to a support plate 1-1 such that the probes 1-2 are vertical to the surface of the support plate 1-1. The support plate 1-1 is made of a material such as polyimides, epoxy resins, silicon or quartz, and the probes 1-2 are made of tungsten, etc.

The support plate 1-1 has a heater 1-3. The heater 1-3 can set the temperature of the probes 1-2 at a desired value. It is desirable that the number of probes 1-2 be equal to that of pads of an LSI (an object to be measured). The positions of tip portions of the probes 1-2 correspond to the positions of the pads of the LSI. The probes 1-2 are connected to a measuring device 1-5 by wires 1-4.

With reference to FIGS. 5 to 9, a characteristic evaluation method using the above apparatus will now be described.

As is shown in FIG. 5, molten gallium (Ga) 2-2 is put in a container 2-1 with an adequately large size. The molten Ga 2-2 is kept at about 35° C. The tip portions of the probes 1-2 are immersed in the molten Ga 2-2.

Figure 7:
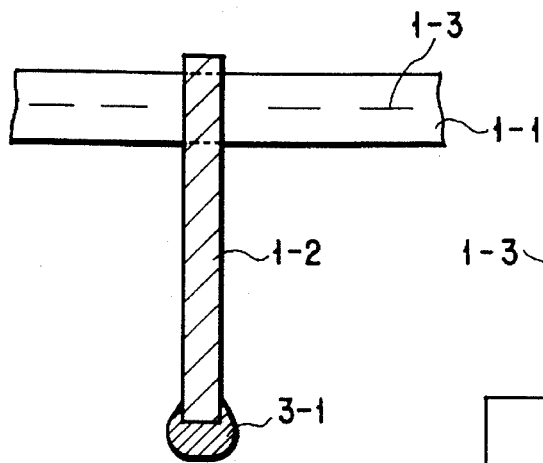
FIG. 7 is an enlarged view of a portion A shown in FIG. 6.

Then, as shown in FIGS. 6 and 7, the probes 1-2 are lifted from the molten Ga 2-2. A predetermined amount of a molten Ga drop adheres to the tip portion of each probe 1-2. At this time, the temperature of the probes 1-2 is raised by the heater 1-3 up to a temperature higher than the melting point of Ga (29.8° C.), e.g. about 40° C. At about 40° C., the probes (e.g. tungsten probes) 1-2 hardly react with the molten Ga 2-2.

Figure 8:
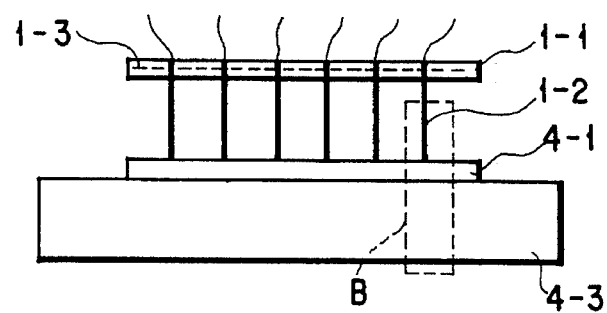
FIG. 8 illustrates another step of the characteristic evaluation method using the apparatus shown in FIG. 3.
Figure 9:
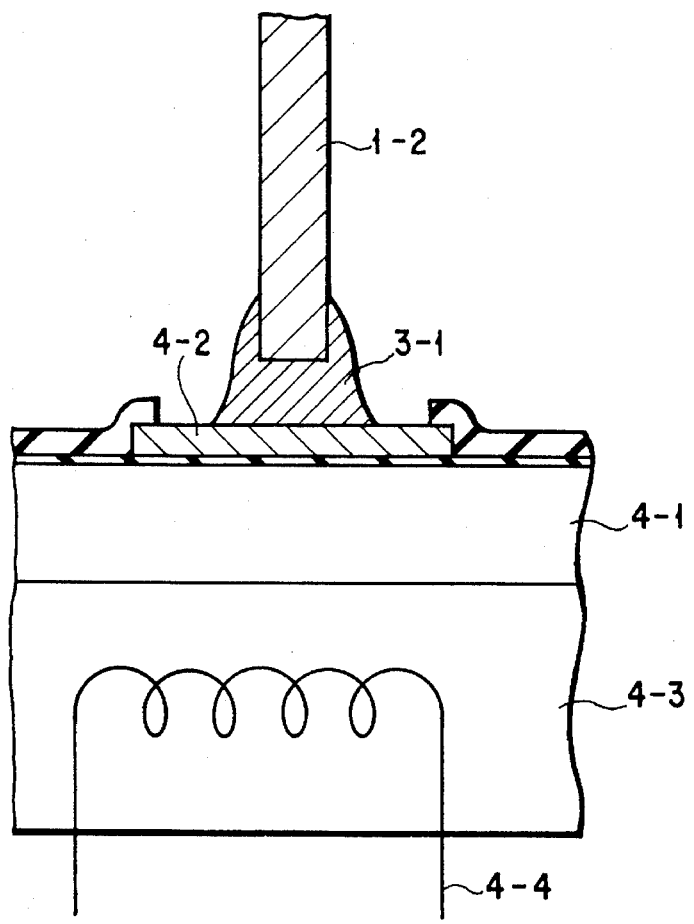
FIG. 9 is an enlarged view of a portion B shown in FIG. 8.

Subsequently, as is shown in FIGS. 8 and 9, the tip portion of the probe 1-2 is moved towards the pad 4-2 of the LSI 4-1. When the probe 1-2 is lowered, the molten Ga drop 3-1 at the tip portion of the probe 1-2 comes into contact with the pad 4-2. In this case, it is not necessary that the probe 1-2 is put in direct contact with the pad 4-2 of the LSI, and it should suffice if the molten Ga drop 3-1 alone is in contact with the pad 4-2.

The LSI 4-1 is mounted on a support table 4-3. The support table 4-3 has a heater 4-4. The LSI 4-1 is kept at the same temperature (about 40° C.) as the probe 1-2 by the heater 4-4.

The pad 4-2 is made of, e.g. aluminum (Al). Accordingly, the molten Ga on the surface of the pad 4-2 immediately reacts with the material of the pad (aluminum) to produce an alloy.

Figure 10:
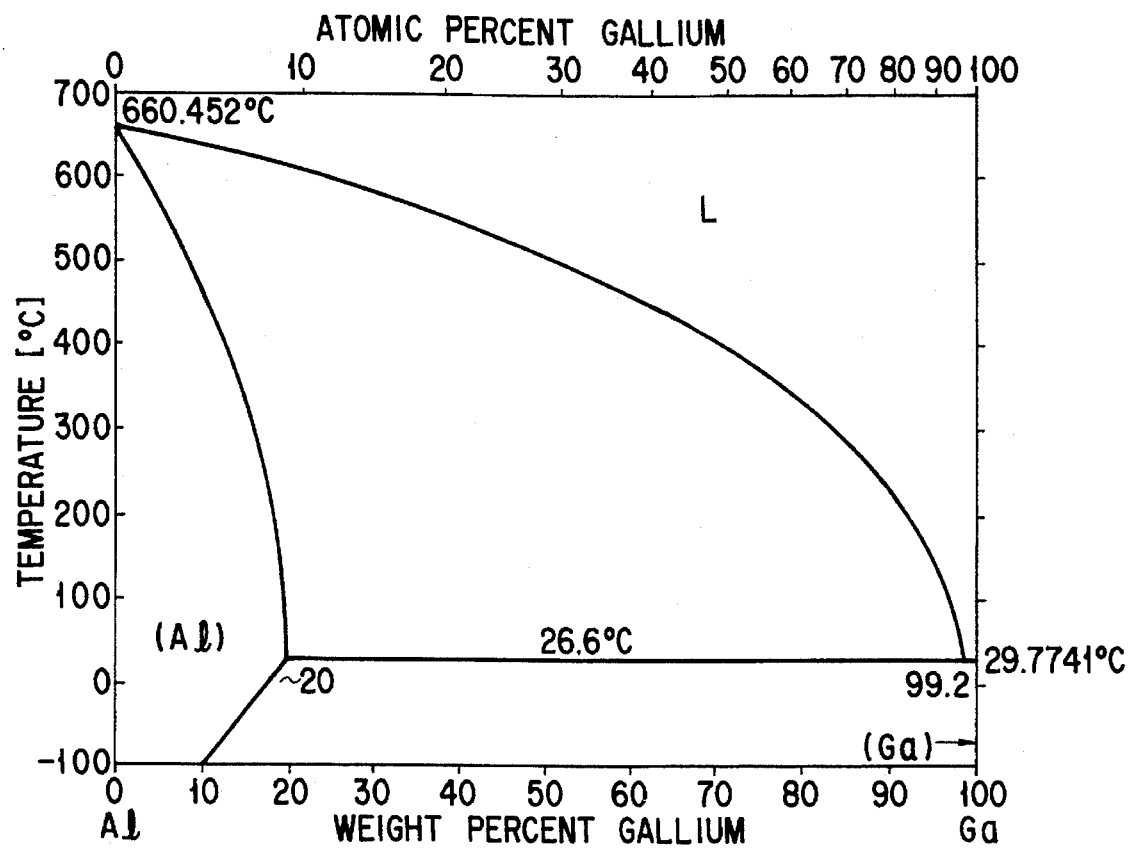
FIG. 10 is a graph showing an equilibrium state of Al-Ga.

As is shown in FIG. 10 (a graph showing an equilibrium state of Al-Ga), for example, at a measuring temperature of about 40° C., contact between the molten Ga and the pad produces a molten alloy of Al (1%) and Ga (99%). More specifically, 1% of the pad (Al) 4-2 is melted in relation to 99% of molten Ga 3-1.

An aluminum oxide film forms on the surface of the pad 4-2. The aluminum oxide film does not react with Ga. Accordingly, the Al oxide film is present in the Al-Ga molten alloy on the pad 4-2 as solid foreign matter. This foreign matter does not adversely affect electric conduction between the pad and probe.

When electric contact between the pad and probe is attained by molten Ga, the value of resistance between the pad 4-2 and probe 1-2 is about 100 mΩ. This resistance value is a sufficient value for exact evaluation of characteristics of the LSI.

After the characteristic evaluation of the LSI is completed, the probe 1-2 is electrically disconnected from the pad 4-2, and the temperature of the LSI 4-1 is restored to room temperature. As a result, the Al-Ga molten alloy remaining on the pad 4-2 of the LSI 4-1 changes to a solid alloy.

The solid Al-Ga alloy has low adhesion to the underlying aluminum pad. Thus, the solid alloy can easily be removed from the pad 4-2 if it is washed with water by means of a brush, etc., and there is no problem in wire bonding, etc.

Each of the above steps is carried out within an atmosphere of nitrogen ($N_2$), argon (Ar), etc., since Ga is a metal which is very active and easily oxidizes.

Figure 11:
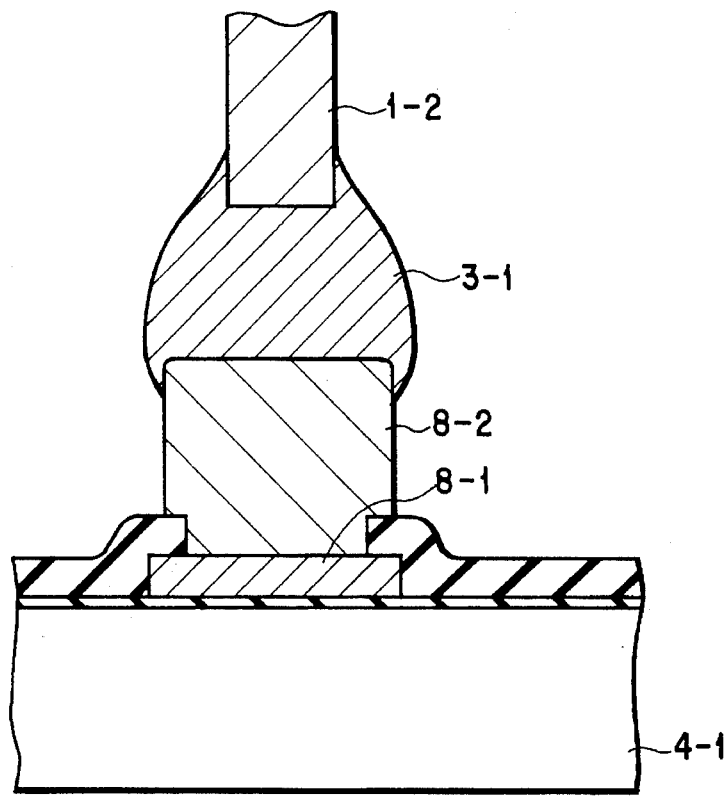
FIG. 11 shows an example of a semiconductor device the characteristics of which can be evaluated by the apparatus shown in FIG. 3.

According to the characteristic evaluation apparatus for semiconductor devices, which has the above-described structure, contact between the pad and probe can be attained. In addition, the characteristics of an LSI having a gold bump, as shown in FIG. 11, can be evaluated.

This LSI has a gold bump 8-2 on an aluminum pad 8-1. The molten Ga 3-1 functions to keep electric contact between the gold bump 8-2 and the probe 1-2.

Figure 12:
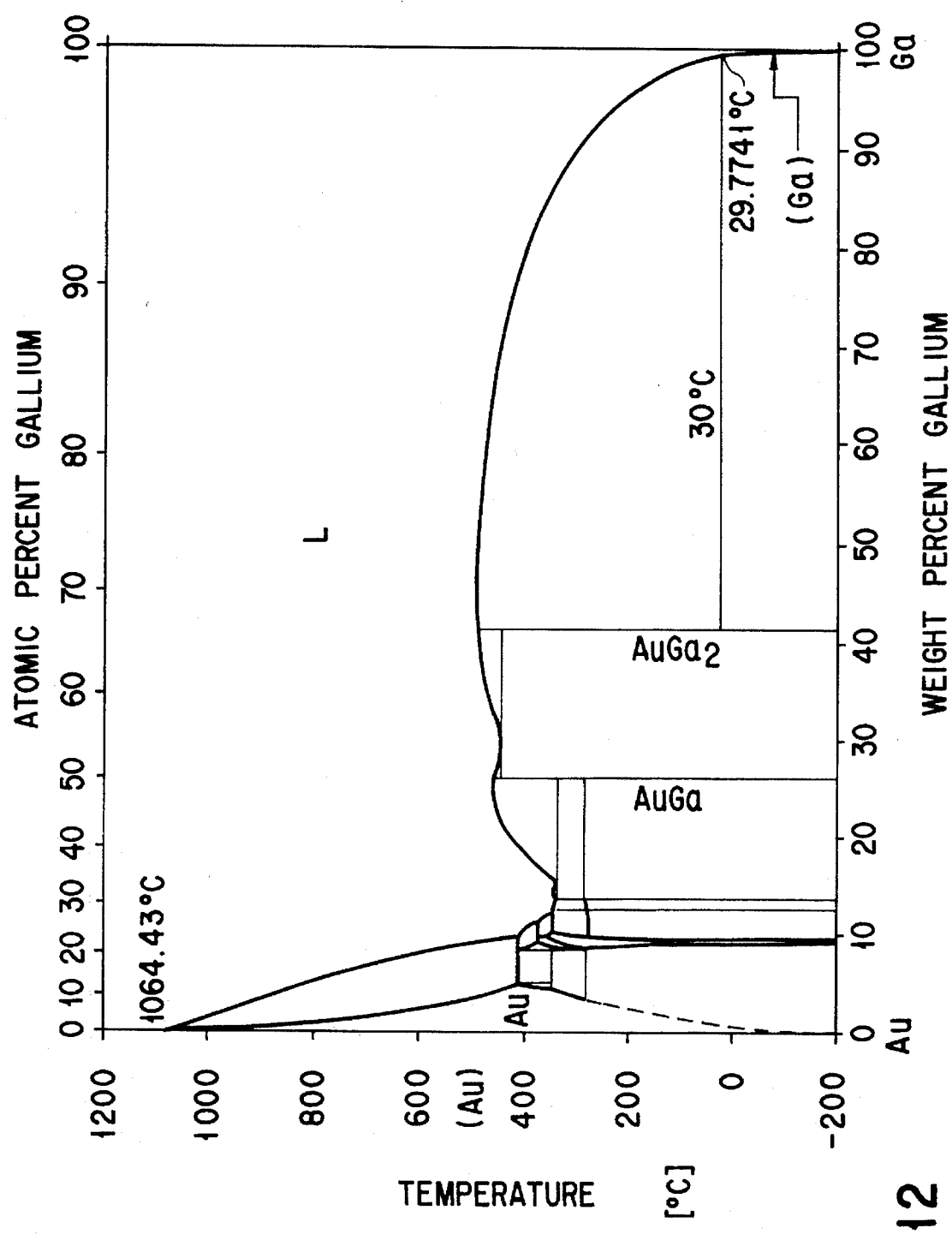
FIG. 12 is a graph showing an equilibrium state of Au-Ga.

In this case, as shown in FIG. 12 (a graph showing an equilibrium state of Au-Ga), for example, at a measuring temperature of about 50° C., gold (Au) and gallium (Ga) react immediately to produce a molten Au-Ga alloy of Ga (99%) and Au (1%).

In the characteristic evaluation of the above LSI, too, no mechanical contact between the probe 1-2 and gold bump 8-2 of the characteristic evaluation apparatus is required. Thus, crack or damage of the underlying bump is prevented.

FIGS. 13 and 14 show an apparatus for evaluating characteristics of a semiconductor device according to a second embodiment of the present invention.

A plurality of thin cylindrical probes 6-2 are attached to a hollow container 6-1. The positions of the tip portions of the probes 6-2 correspond to the positions of pads of an LSI to be measured. The hollow container 6-1 and probes 6-2 are kept at a desired temperature (e.g. 40° C.) by a heater 6-3.

A small-sized pump 6-4 is connected to the hollow container 6-1. The pump 6-4 functions to slightly increase or decrease the pressure within the container 6-1. The probes (made of, e.g. tungsten) 6-2 are connected to a measuring device 6-6 by wires 6-5.

FIGS. 15 and 16 show the connection between the hollow container 6-1 and probe 6-2 in detail.

In FIG. 15, the hollow container 6-1 and probe 6-2 are made of different materials, and the hollow container 601 is coupled to the probe 6-2. In this case, the hollow container 6-1 is made of a material such as quartz, and the probe 6-2 is made of a material such as tungsten. The wires 6-5 is connected to a predetermined portion (e.g. an upper portion) of the probe 6-2.

In FIG. 16, the hollow container 6-1 and probe 6-2 are simultaneously made of the same material, and the container 6-1 and probe 6-2 are integrally formed as one unit. In this case, both the hollow container 6-1 and probe 6-2 are made of a material such as polyimides, epoxy resins or quartz. The wire 6-5 is connected to a predetermined portion (e.g. a central portion) of the probe 6-2 and is put in contact with molten Ga 6-7.

Figure 19:
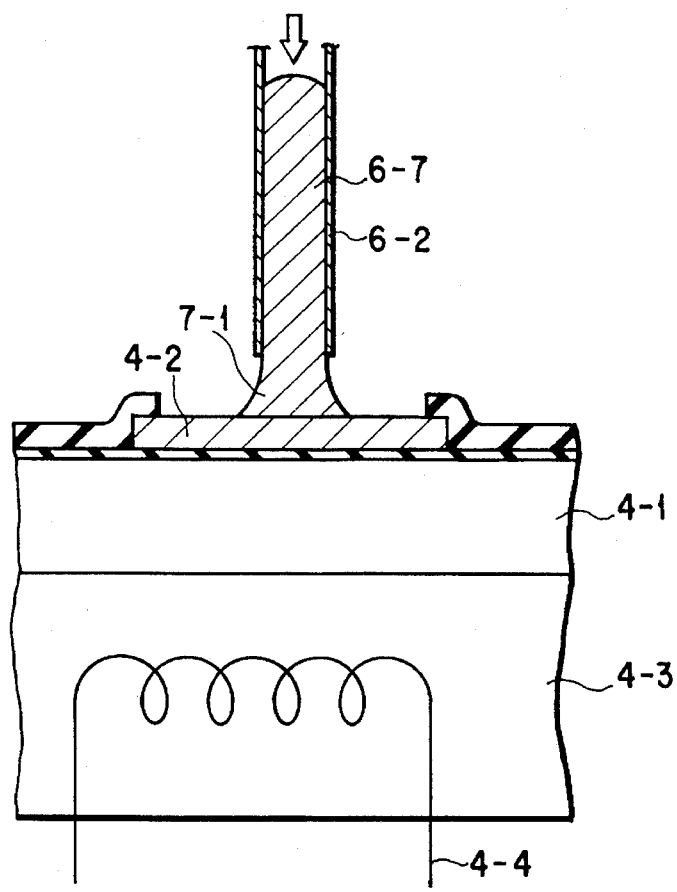
FIG. 19 is an enlarged view of a portion C shown in FIG. 18.

With reference to FIGS. 17 to 19, a characteristic evaluation method using the above-described apparatus according to the second embodiment will now be described.

As is shown in FIG. 17, tip portions of the probes 6-2 are immersed in molten Ga. The pressure within the hollow container 6-1 is decreased by the pump 6-4 to a negative pressure value, and a predetermined amount of molten Ga 6-7 is sucked in the probes 6-2. At this time, the temperature of the hollow container 6-1 and probes 6-2 is kept at about 40° C. by the heater 6-3.

Then, as shown in FIG. 18 and 19, the tip portions of the probes 6-2 are moved towards the pads of the LSI 4-1, with the negative pressure within the hollow container 6-1 maintained. Thereafter, the pressure within the hollow container 6-1 is slightly increased by the pump 6-4, and a drop 7-1 of molten Ga 6-7 forms at the tip portion of the probe 6-2. The drop 7-1 is put in contact with the pad 4-2 of the LSI.

In this case, it is not necessary that the probe 6-2 is put in direct contact with the pad 4-2 of the LSI, and it should suffice if the molten Ga drop 7-1 alone is in contact with the pad 4-2.

The LSI 4-1 is mounted on a support table 4-3. The support table 4-3 has a heater 4-4. The LSI 4-1 is kept at the same temperature (about 40° C.) as the probe 6-2 by the heater 4-4.

The pad 4-2 is made of, e.g. aluminum (Al). Accordingly, the molten Ga on the surface of the pad 4-2 immediately reacts with the material of the pad (aluminum) to produce an alloy. At a measuring temperature of about 40° C., contact between the molten Ga and the pad produces a molten alloy of Al (1%) and Ga (99%). More specifically, 1% of the pad (Al) 4-2 is melted in relation to 99% of molten Ga 6-1.

An aluminum oxide film forms on the surface of the pad 4-2. The aluminum oxide film does not react with Ga. Accordingly, the Al oxide film is present in the Al-Ga molten alloy on the pad 4-2 as solid foreign matter. This foreign matter does not adversely affect electric conduction between the pad and probe.

When electric contact between the pad and probe is attained by molten Ga, the value of resistance between the pad 4-2 and probe 6-2 is about 100 mΩ. This resistance value is a sufficient value for exact evaluation of characteristics of the LSI.

If the pressure within the hollow container 6-1 is decreased by the pump 6-4 after the characteristic evaluation of the LSI 4-1 is completed, the drop 7-1 can easily be sucked back into the probe 6-2. Accordingly, the aluminum pad 4-2 of the LSI 4-1 is slightly recessed by an amount of aluminum removed by reaction with the molten Ga 6-7, but the aluminum pad 402 is not greatly eroded. In addition, since the molten Ga 6-7 on the aluminum pad 4-2 is recovered into the probe 6-2, solid matter of the Al-Ga alloy does not remain on the aluminum pad 4-2.

Each of the above steps is carried out within an atmosphere of nitrogen ($N_2$), argon (Ar), etc., since Ga is a metal which is very active and easily oxidizes.

According to the present embodiment, as the LSI characteristic evaluation is repeated, the concentration of aluminum in the molten Ga 6-7 held by the probe 6-2 increases, and the molten Al-Ga alloy will reach the equilibrium state at 40° C. and will not react with aluminum.

In such a case, the LSI characteristic evaluation can be continued by a) increasing the temperature of the molten Ga (see FIG. 10) or b) replacing the molten Ga with a high concentration of Al with new molten Ga.

Figure 20:
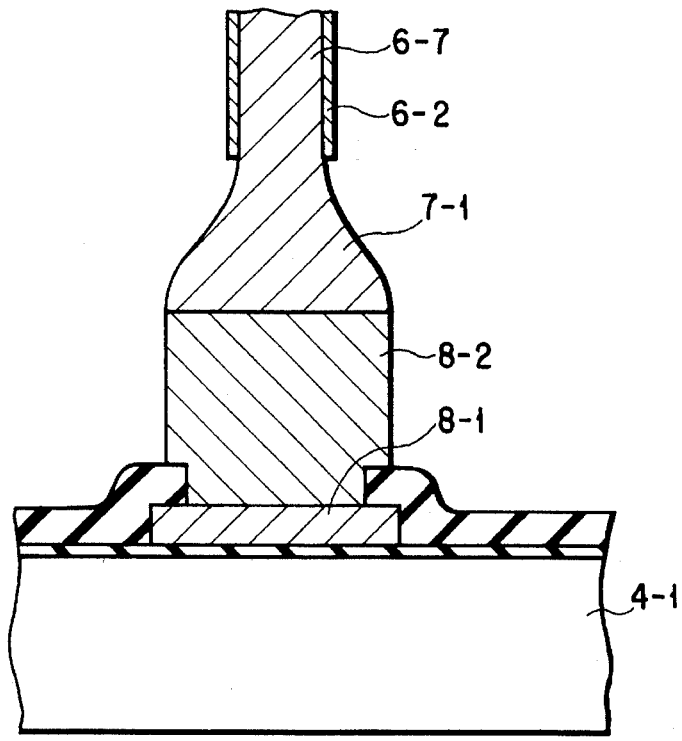
FIG. 20 shows an example of a semiconductor device the characteristics of which can be evaluated by the apparatus shown in FIG. 13.

According to the characteristic evaluation apparatus for semiconductor devices, which has the above-described structure, contact between the pad and probe can be attained. In addition, the characteristics of an LSI having a gold bump, as shown in FIG. 20, can be evaluated.

This LSI has a gold bump 8-2 on an aluminum pad 8-1. The drop 7-1 of molten Ga 6-7 functions to keep electric contact between the gold bump 8-2 and the probe 6-2.

In this case, as shown in FIG. 12 (a graph showing an equilibrium state of Au-Ga), for example, at a measuring temperature of about 50° C., gold (Au) and gallium (Ga) react immediately to produce a molten Au-Ga alloy of Ga (99%) and Au (1%).

In the characteristic evaluation of the above LSI, too, no mechanical contact between the probe 6-2 and gold bump 8-2 of the characteristic evaluation apparatus is required. Thus, crack or damage of the underlying bump is prevented.

In the case where the cylindrical probe is used and the molten Ga is sucked by the pump, the amount of the molten Ga can be monitored exactly. Therefore, the LSI characteristics can be evaluated with use of such an amount of molten Ga that the underlying pad, etc. are not adversely affected.

As has been described above, in the apparatus for evaluating characteristics of semiconductor device according to the present invention, the probe has a function of holding molten gallium (Ga) and the probe and the pad of the LSI are electrically connected via the molten Ga. Specifically, since the molten Ga reacts chemically with the underlying pad, etc. to produce a molten alloy, the oxide film adhering on the surface of the pad, etc. can be removed at the same time.

Unlike the prior art, there is no need to put the probe in direct contact with the pad to mechanically remove the oxide film on the surface of the pad, and no damage is caused to the pad or peripheral protective film. Furthermore, since there is no need to put the probe in direct contact with the pad, it is not necessary to consider sliding or displacement of the probe in the horizontal direction. In other words, electric contact between the pad and probe can be attained vertically to the surface of the pad. Therefore, probes can be arranged at high density, contributing to characteristic evaluation of an LSI with pads of a narrow pitch and many pins.

Figure 21:
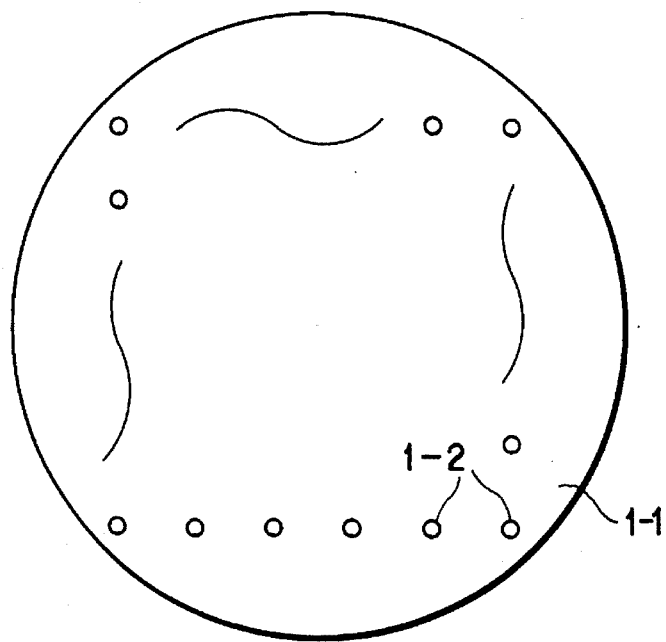
FIG. 21 shows a support plate in the apparatus shown in FIG. 3.
Figure 22:
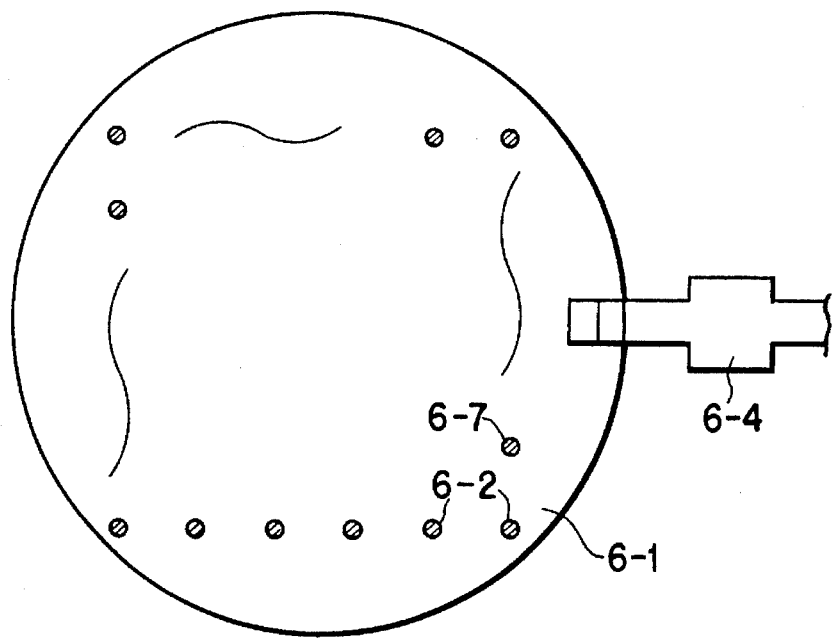
FIG. 22 shows a hollow container of the apparatus shown in FIG. 13.

In the first embodiment, as shown in FIG. 21, the support plate 1-1 may have a circular shape. In the second embodiment, as shown in FIG. 22, the hollow container may have a circular shape.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for evaluating characteristics of a semiconductor device, said apparatus comprising:

a support plate;

a needle-like probe having a first end and a second end, said second end being supported by said support plate, said first end having a tip portion situated at a position corresponding to a position of an electrode of said semiconductor device to be measured, said probe being connected to a measuring device for evaluating the characteristics of the semiconductor device;

a heater for setting the temperature of said first end of said probe; and a molten metal held by said first end of said probe.

2. The apparatus according to claim 1, wherein said probe is attached to said support plate vertically to the surface of said support plate.

3. The apparatus according to claim 1, wherein said support plate is made of a material selected from the group consisting of polyimides, epoxy resins, quartz and silicon, and said probe is made of tungsten.

4. The apparatus according to claim 1, wherein said molten metal is molten gallium.

5. The apparatus according to claim 1, wherein said semiconductor device is supported by a support table, and said support table includes a heater for setting the temperature of said semiconductor device.

6. The apparatus according to claim 1, wherein said probe and said measuring device are interconnected by wiring.

7. A method of evaluating characteristics of a semiconductor device by utilizing a needle-like probe having a first and a second end, comprising the steps of:

electrically connecting said second end of said probe to a measuring device;

forming a drop of a molten metal at a tip portion of said first end of said probe situated at a position corresponding to a position of an electrode of the semiconductor device to be measured, said drop of the molten metal being formed by immersing said tip portion of said probe in the molten metal and then pulling up said probe;

bringing said drop of the molten metal into contact with said electrode of the semiconductor device, and electrically connecting said semiconductor device and said probe; and applying an electric signal to the semiconductor device and evaluating the characteristics of the semiconductor device.

8. The method according to claim 7, wherein said probe and said drop of the molten metal are kept at a temperature higher than a melting point of said drop of the molten metal.

9. The method according to claim 7, wherein said semiconductor device is kept at a temperature higher than a melting point of said drop of the molten metal.

10. The method according to claim 7, wherein said method is carried out in an atmosphere of one selected from the group consisting of nitrogen and argon.

11. The method according to claim 7, wherein after a reaction between said molten metal and said electrode has reached an equilibrium state, the evaluation of the characteristics of the semiconductor device is continued by a step of replacing the drop of the molten metal with a new drop of the molten metal.

12. A method of evaluating characteristics of first and second semiconductor devices by utilizing a needle-like probe having a first and second end, comprising the steps of:

electrically connecting said second end of said probe to a measuring device;

forming a drop of a molten metal at a tip portion of said first end of said probe situated at a position corresponding to a position of an electrode of the first semiconductor device to be measured;

bringing said drop of the molten metal into contact with said electrode of the first semiconductor device, and electrically connecting said first semiconductor device and said probe;

applying an electric signal to the first semiconductor device and evaluating the characteristics of the first semiconductor device;

increasing the temperature of the molten metal;

bringing said drop of the molten metal into contact with said electrode of the second semiconductor device, and electrically connecting said second semiconductor device and said probe; and applying an electric signal to the second semiconductor device and evaluating the characteristics of the second semiconductor device.

13. The method according to claim 12, wherein said drop of the molten metal is formed by immersing the tip portion of the probe in said molten metal and then pulling up said probe.

14. The method according to claim 12, wherein said probe and said drop of the molten metal are kept at a temperature higher than a melting point of said molten metal.

15. The method according to claim 12, wherein said semiconductor device is kept at a temperature higher than a melting point of said molten metal.

16. The method according to claim 12, wherein said method is carried out in an atmosphere of one selected from the group consisting of nitrogen and argon.

17. The method according to claim 12, wherein after a reaction between said molten metal and said electrode has reached an equilibrium state, the evaluation of the characteristics of the semiconductor device is continued by a step of replacing the drop of the molten metal with a new drop of the molten metal.

* * * * *